United States Patent
Eom et al.

(10) Patent No.: US 10,985,345 B2
(45) Date of Patent: Apr. 20, 2021

(54) ORGANIC LIGHT EMITTING DIODE DISPLAY DEVICE

(71) Applicant: LG DISPLAY CO., LTD., Seoul (KR)

(72) Inventors: Hyeon-Yong Eom, Paju-si (KR); Chul Park, Paju-si (KR); Seung-Hwan Lee, Paju-si (KR); Chan-Hee Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/559,211

(22) Filed: Sep. 3, 2019

(65) Prior Publication Data

US 2020/0075889 A1 Mar. 5, 2020

(30) Foreign Application Priority Data

Sep. 3, 2018 (KR) .................. 10-2018-0104613
Aug. 2, 2019 (KR) .................. 10-2019-0094197

(51) Int. Cl.
*H01L 51/52* (2006.01)
*H01L 27/32* (2006.01)
*H05K 1/18* (2006.01)

(52) U.S. Cl.
CPC ...... *H01L 51/5253* (2013.01); *H01L 27/3244* (2013.01); *H01L 51/5246* (2013.01); *H05K 1/189* (2013.01); *H05K 2201/10128* (2013.01)

(58) Field of Classification Search
CPC . H01L 27/32; H01L 2227/32; H01L 27/3209; H01L 27/3251; H01L 27/3253; H01L 27/3258; H01L 27/3262; H01L 51/5246; H01L 51/5253; H01L 27/3244; H01L 51/5293; H01L 2227/326; H01L 51/0096; H05K 1/189; H05K 2201/10128
See application file for complete search history.

(56) References Cited

U.S. PATENT DOCUMENTS

2010/0264817 A1* 10/2010 Bouten ............ G02F 1/133305
  313/512
2014/0340925 A1* 11/2014 McCabe .............. F21S 43/14
  362/540

FOREIGN PATENT DOCUMENTS

KR 10-2017-0073993 A 6/2017

* cited by examiner

*Primary Examiner* — Thanh Y. Tran
(74) *Attorney, Agent, or Firm* — Birch, Stewart, Kolasch & Birch, LLP

(57) ABSTRACT

An organic light emitting diode display device includes a display panel including an array substrate displaying an image, a face sealing adhesive layer attached to the array substrate, a side sealing layer covering a side surface of the array substrate, and a protecting substrate attached to the array substrate through the face sealing adhesive layer; and a printed circuit board attached to the protecting substrate.

10 Claims, 10 Drawing Sheets

ORGANIC LIGHT EMITTING DIODE DISPLAY DEVICE

CROSS REFERENCE TO RELATED APPLICATIONS

The present application claims the priority benefit of Korean Patent Application No. 10-2018-0104613 filed in the Republic of Korea on Sep. 3, 2018 and Korean Patent application No. 10-2019-0094197 filed in the Republic of Korea on Aug. 2, 2019, all of these applications are hereby incorporated by reference in their entirety for all purposes as if fully set forth herein.

BACKGROUND OF THE INVENTION

Field of the Invention

The present invention relates to an organic light emitting diode display device, and more particularly, to an organic light emitting diode display device including a display panel having a protecting substrate.

Discussion of the Related Art

Recently, a flat panel display (FPD) having a thin profile, a light weight and a low power consumption has been developed and applied to various fields.

In an organic light emitting diode (OLED) display device among flat panel displays, charges are injected into a light emitting layer between a cathode of an electron injecting electrode and an anode of a hole injecting electrode to form an exciton, and the exciton transitions from an excited state to a ground state to emit a light.

A set apparatus including an OLED display device as a finished product may be used for a television, a monitor of a computer and a billboard. The set apparatus of the OLED display device includes a plurality of frames supporting and accommodating a display panel. To constitute an exterior of the set apparatus of the OLED display device and to protect the display panel, the plurality of frames are required to have a predetermined rigidity. In addition, the plurality of frames are required to have a function of radiating heat generated from the display panel or a control circuit to the outside of the OLED display device.

SUMMARY OF THE INVENTION

Accordingly, the present invention is directed to an organic light emitting diode display device that substantially obviates one or more of the problems due to limitations and disadvantages of the related art.

An object of the present invention is to provide an organic light emitting diode display device where a printed circuit board is directly attached to a protecting substrate having a relatively great rigidity.

Another object of the present invention is to provide an organic light emitting diode display device where a protecting substrate has a relatively great rigidity and includes a pattern layer.

Additional features and advantages of the invention will be set forth in the description which follows, and in part will be apparent from the description, or can be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device includes a display panel including an array substrate displaying an image, a face sealing adhesive layer attached to the array substrate, a side sealing layer covering a side surface of the array substrate, and a protecting substrate attached to the array substrate through the face sealing adhesive layer; and a printed circuit board attached to the protecting substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
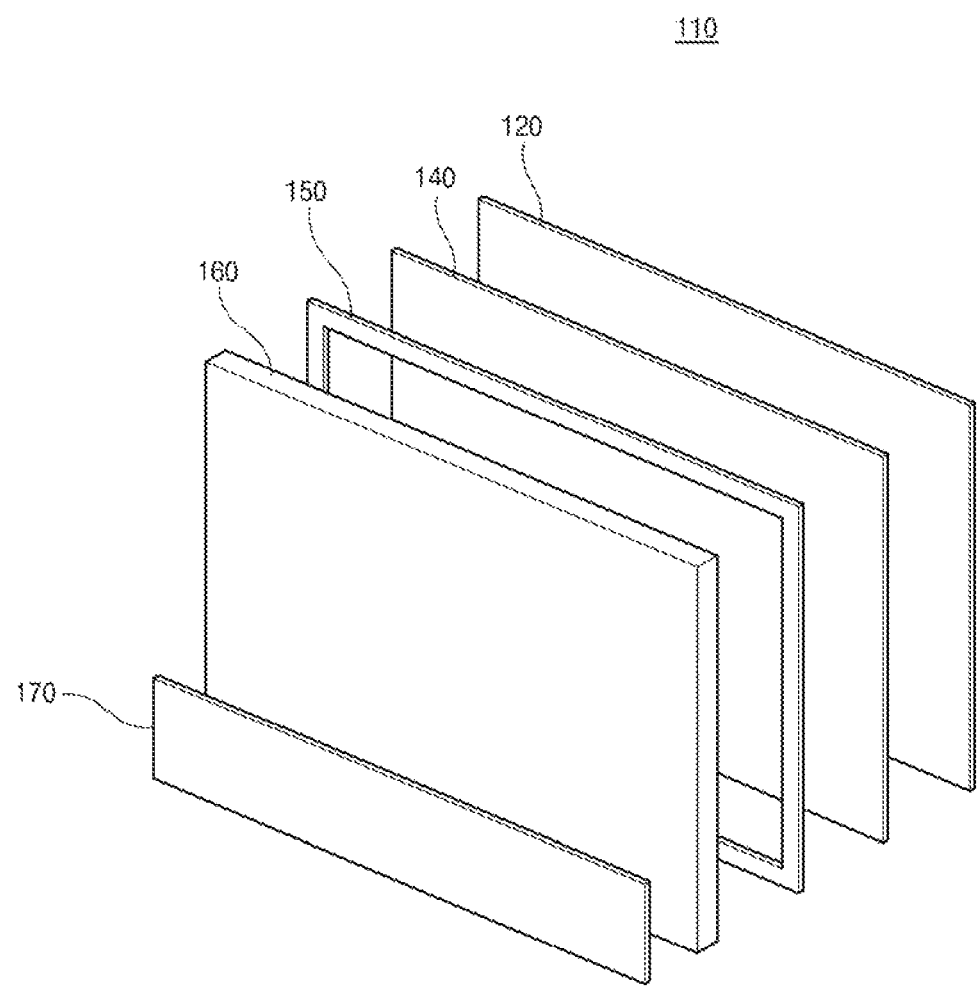
FIG. 1 is an exploded perspective view showing an organic light emitting diode display device according to a first embodiment of the present disclosure.

Reference will now be made in detail to embodiments of the present disclosure, examples of which can be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and can be changed as is known in the art, with the exception of steps and/or operations necessarily occurring in a particular order. Like reference numerals designate like elements throughout. Names of the respective elements used in the following explanations are selected only for convenience of writing the specification and can be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration can be omitted. In a case where terms "comprise," "have," and "include" described in the present specification are used, another part can be added unless a more limiting term, such as "only," is used. The terms of a singular form can include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts can be disposed between the two parts unless a more limiting term, such as "just" or "direct(ly)," is used.

In describing a time relationship, when the temporal order is described as, for example, "after," "subsequent," "next," or "before," a case which is not continuous can be included unless a more limiting term, such as "just," "immediate(ly)," or "direct(ly)," is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" can be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure can be partially or overall coupled to or combined with each other, and can be variously inter-operated with each other and driven technically as those skilled in the art can sufficiently understand. Embodiments of the present disclosure can be carried out independently from each other, or can be carried out together in co-dependent relationship.

Reference will now be made in detail to the present disclosure, examples of which are illustrated in the accompanying drawings.

Figure 2:
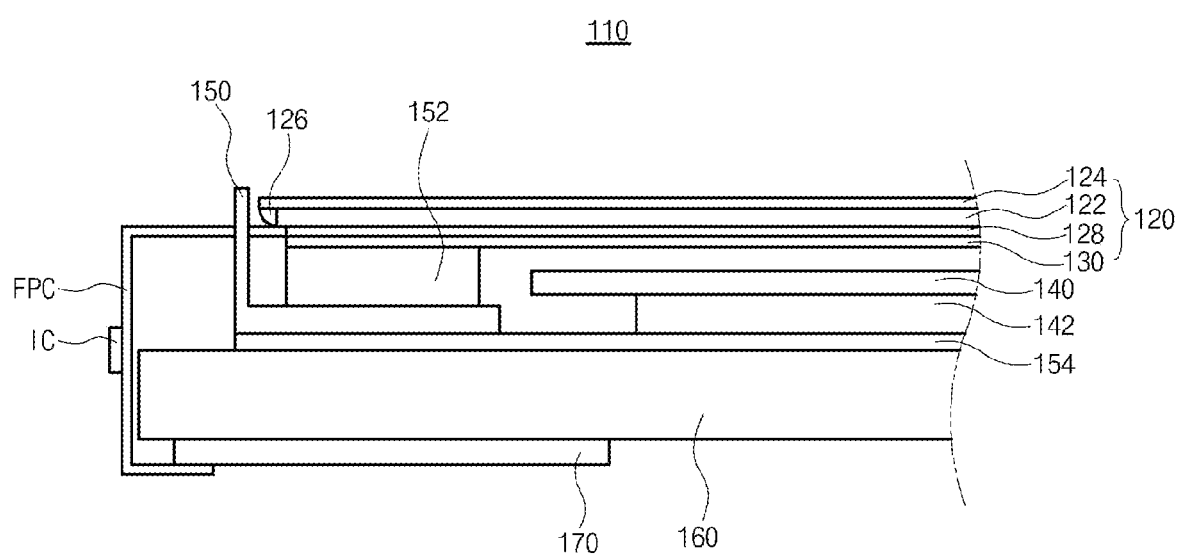
FIG. 2 is a cross-sectional view showing the organic light emitting diode display device according to the first embodiment of the present disclosure.

FIG. 1 is an exploded perspective view showing an organic light emitting diode display device according to a first embodiment of the present disclosure, and FIG. 2 is a cross-sectional view showing the organic light emitting diode display device according to the first embodiment of the present disclosure. All the components of the organic light emitting diode display device according to all embodiments of the present disclosure are operatively coupled and configured.

In FIGS. 1 and 2, an organic light emitting diode (OLED) display device 110 according to the first embodiment of the present disclosure includes a display panel 120, an inner plate 140, a middle cabinet 150, a cover bottom 160 and a printed circuit board (PCB) 170.

The display panel 120 includes an array substrate 122, a polarizing plate 124, a side sealing layer 126, a face sealing adhesive layer 128 and a face sealing metal layer 130.

The array substrate 122 displays an image using a gate signal and a data signal, and the polarizing plate 124 prevents reflection of an external light.

The polarizing plate 124 has a size greater than a size of the array substrate 122 and is attached to a first surface of the array substrate 122. The side sealing layer 126 covers a side surface of the array substrate 122 and a portion of the polarizing plate 124 exposed through the side surface of the array substrate 122 to block a moisture or an oxygen of an exterior penetrating into the array substrate 122.

The face sealing adhesive layer 128 is attached to a second surface of the array substrate 122, and the face sealing metal layer 130 is attached to the face sealing adhesive layer 128. The face sealing adhesive layer 128 and the face sealing metal layer 130 block an external moisture or an external oxygen penetrating into the array substrate 122, and the face sealing metal layer 130 maintains a rigidity of the array substrate 122.

For example, the face sealing metal layer 130 can include a metallic material. The face sealing metal layer 130 can have a thickness of about 0.08 mm, a Young's modulus of about 148 GPa, a density of about 0.29 1 lb/in$^3$ and a thermal conductivity of about 10.15 W/mK.

The inner plate 140 is fixed to the cover bottom 160 through a second fixing tape 142 such as a double sided tape.

The middle cabinet 150 of a rectangular ring shape supports an edge portion of the display panel 120 and protects a side surface of the display panel 120. Further, the middle cabinet 150 constitutes a side exterior of the OLED display device 110.

The display panel 120 is fixed to the middle cabinet through a first fixing tape 152 such as a double sided tape.

The cover bottom 160 of a plate shape is disposed under the middle cabinet 150 and the inner plate 140. The cover bottom 10 can be formed of an advanced composite material (ACM) for obtain a rigidity and a radiation property.

A pattern film 154 is disposed on a first surface of the cover bottom 160 corresponding to the middle cabinet 150 and the inner plate 140. The OLED display panel 110 has an exterior of various designs and colors due to the pattern film 154.

The PCB 170 is disposed under the cover bottom 160. The PCB 170 generates a plurality of control signals and an image data using a plurality of timing signals and an image signal and transmits the plurality of control signals and the image data to an integrated circuit (IC) through a flexible printed circuit (FPC).

The integrated circuit can be mounted on the flexible printed circuit. The integrated circuit can generate a gate signal and a data signal using the plurality of control signals and the image data and can transmit the gate signal and the data signal to the display panel 120 through the flexible printed circuit.

The PCB 170 can be fixed to the inner plate 140 through the cover bottom 160. These features will be illustrated with reference to drawings.

Figure 3A:
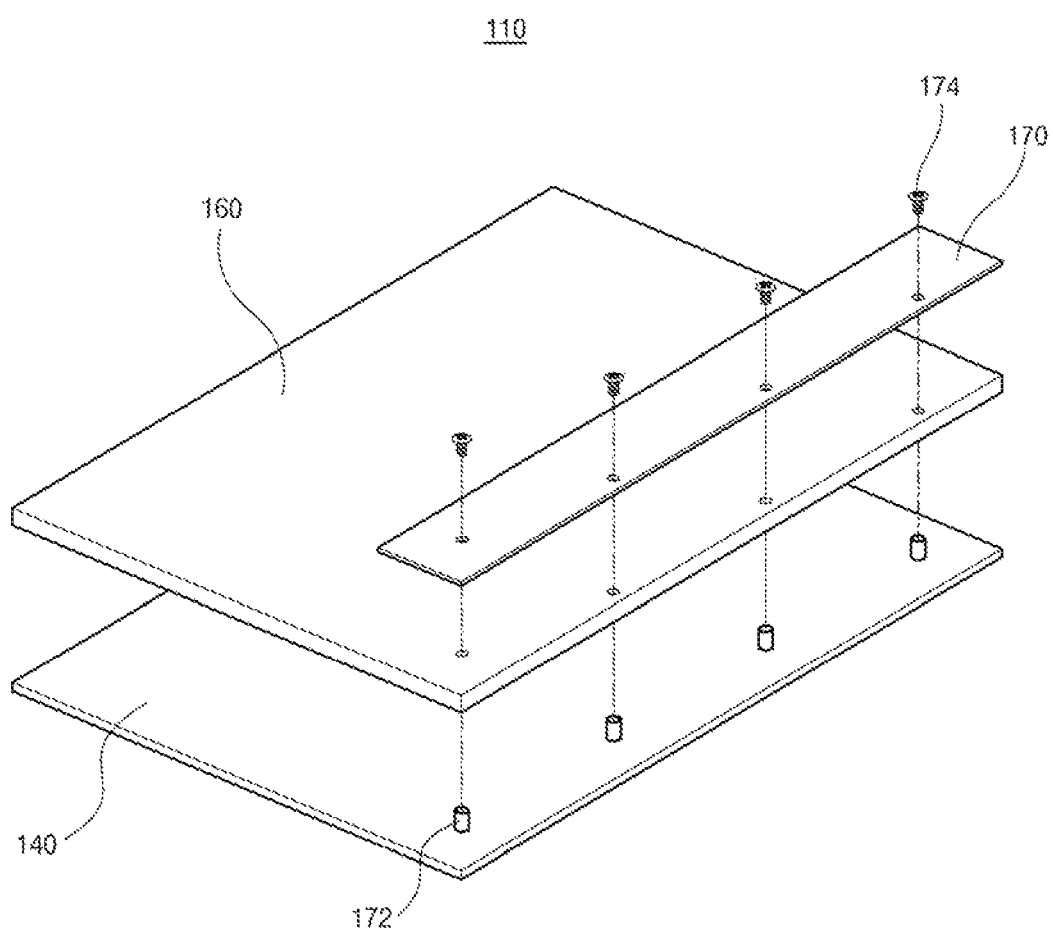
FIG. 3A is an exploded perspective view showing an inner plate, a cover bottom and a printed circuit board of the organic light emitting diode display device according to the first embodiment of the present disclosure
Figure 3B:
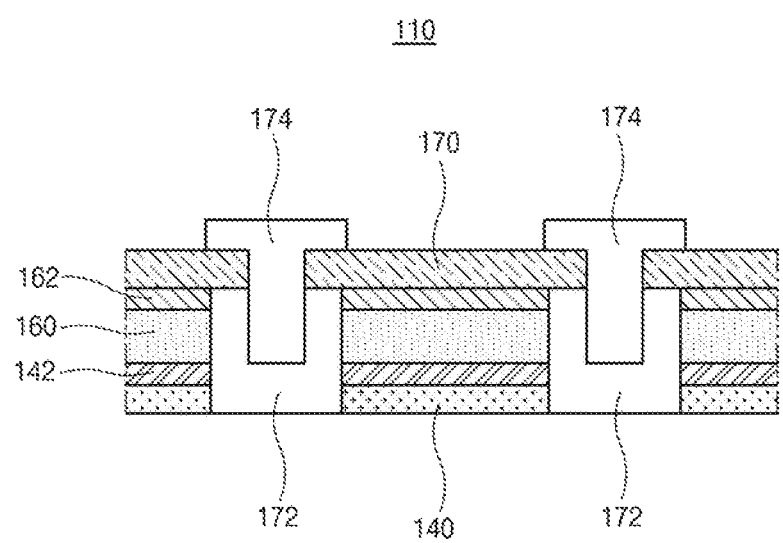
FIG. 3B is a cross-sectional view showing the inner plate, the cover bottom and the printed circuit board of the organic light emitting diode display device according to the first embodiment of the present disclosure.

FIGS. 3A and 3B are an exploded perspective view and a cross-sectional view, respectively, showing an inner plate, a cover bottom and a printed circuit board of the organic light emitting diode display device according to the first embodiment of the present disclosure.

In FIGS. 3A and 3B, the PCB 170 of the OLED display device 110 is fixed to the cover bottom 160 and the inner plate 140 using a plurality of nuts 172 and a plurality of bolts 174.

The plurality of nuts 172 such as a PEM nut are disposed on and fixed to the inner plate 140, and a plurality of first combining holes and a plurality of second combining holes are formed in the cover bottom 160 and the PCB 170, respectively. The plurality of bolts 174 are combined to the plurality of nuts 172 through the plurality of second combining holes of the PCB 170 and the plurality of first combining holes of the cover bottom 160, and the PCB 170 is fixed to the inner plate 140 through the cover bottom 160.

Since the second fixing tape 142 is disposed between the inner plate 140 and the cover bottom 160 and a third fixing tape 162 is disposed between the cover bottom 160 and the PCB 170, a combining force of the inner plate 140, the cover bottom 160 and the PCB 170 can be supplemented.

In the OLED display device 110 according to the first embodiment of the present disclosure, since the display panel 120 is supported by the middle cabinet 150 and the rigidity and the radiation property of the cover bottom 160 are supplemented by the inner plate 140, the exterior of various designs and colors of the OLED display device 110 is obtained and the rigidity and the radiation property of the OLED display device 110 are improved.

Since the display panel 120 is fixed to the middle cabinet 150 through the first fixing tape 152, deterioration such as a detachment can occur and attachment reliability can be reduced.

In addition, since a gap exists between the display panel 120 and the cover bottom 160, deterioration such as a crack can occur in the display panel 120 due to a press caused by an external pressure.

Further, the OLED display device 110 may have a design limitation such as a gap in an edge portion due to an attachment through the first fixing tape 152.

To remedy the above limitation, a display panel can be formed to include a protecting substrate and a printed circuit board can be directly attached to the display panel. These features will be illustrated with reference to drawings.

Figure 4:
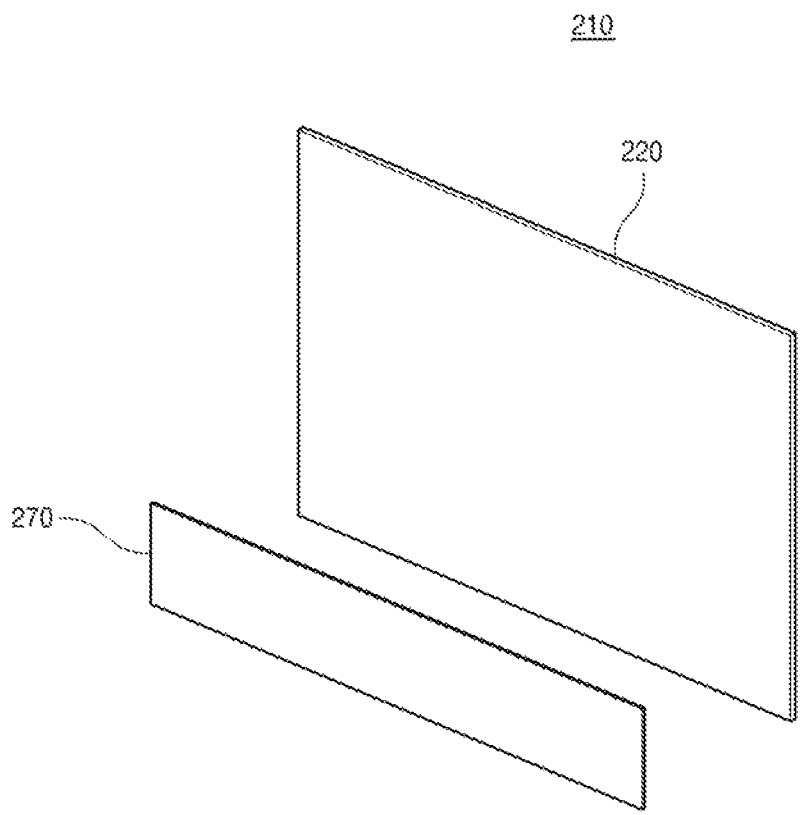
FIG. 4 is an exploded perspective view showing an organic light emitting diode display device according to a second embodiment of the present disclosure.
Figure 5:
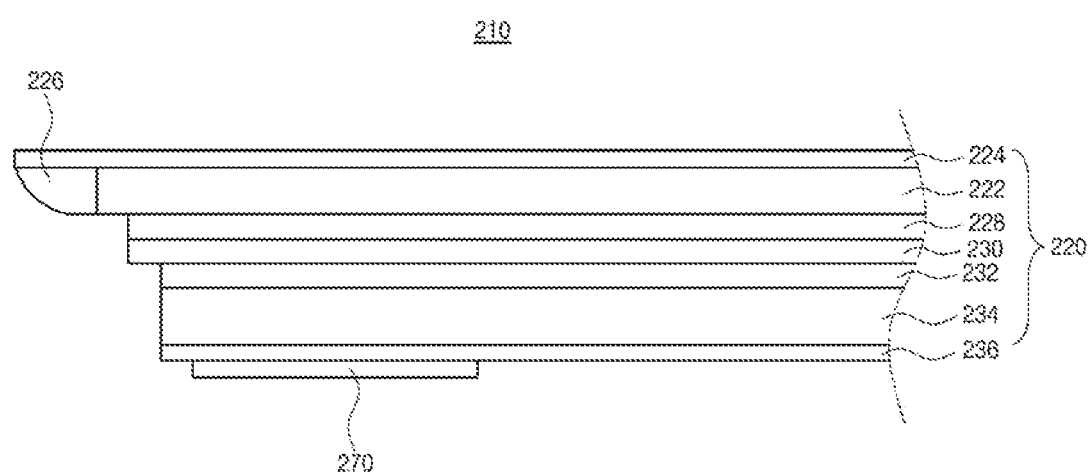
FIG. 5 is a cross-sectional view showing the organic light emitting diode display device according to the second embodiment of the present disclosure.

FIG. 4 is an exploded perspective view showing an organic light emitting diode display device according to a second embodiment of the present disclosure, and FIG. 5 is a cross-sectional view showing the organic light emitting diode display device according to the second embodiment of the present disclosure.

In FIGS. 4 and 5, an organic light emitting diode (OLED) display device 210 according to the second embodiment of the present disclosure includes a display panel 320 and a printed circuit board (PCB) 270.

The display panel 220 includes an array substrate 222, a polarizing plate 224, a side sealing layer 226, a face sealing adhesive layer 228, a face sealing metal layer 230, a heat conductive adhesive layer 232, a protecting substrate 234 and a pattern film 236.

The array substrate 222 displays an image using a gate signal and a data signal, and the polarizing plate 224 prevents reflection of an external light.

The polarizing plate 224 has a size greater than a size of the array substrate 222 and is attached to a first surface of the array substrate 222. The side sealing layer 226 covers a side surface of the array substrate 222 and the polarizing plate 224 exposed outside the array substrate 222 to block an external moisture or an external oxygen penetrating into the array substrate 222.

The face sealing adhesive layer 228 is attached to a second surface of the array substrate 222, and a first surface of the face sealing metal layer 230 is attached to the face sealing adhesive layer 228. The face sealing metal layer 230 is attached to the array substrate through the face sealing adhesive layer 228.

The face sealing adhesive layer 228 and the face sealing metal layer 230 block an external moisture or an external oxygen penetrating into the array substrate 222, and the face sealing metal layer 230 maintains a rigidity of the array substrate 222.

For example, the face sealing metal layer 230 can have a thickness of about 0.08 mm, a Young's modulus of about 148 GPa, a density of about 0.291 lb/in$^3$ and a heat conductivity of about 10.15 W/mK.

The heat conductive adhesive layer 232 is attached to a second surface of the face sealing metal layer 230, and a first surface of the protecting substrate 234 is attached to the heat conductive adhesive layer 232. The protecting substrate 234 is attached to the array substrate 222 through the heat conductive adhesive layer 232.

For example, the heat conductive adhesive layer 232 can include a resin such as an acryl, an epoxy and a urethane. The heat conductive adhesive layer 232 can be formed on a lower surface of the face sealing metal layer 230 through a coating method, or the heat conductive adhesive layer 232 of a tape shape can be attached to a lower surface of the face sealing metal layer 230.

The heat conductive adhesive layer 232 can further include a heat conductive material such as a metal particle to transmit a heat of the array substrate 222 to the protecting substrate 234.

The protecting substrate 234 radiates a heat of the array substrate 222. Specifically, the protecting substrate 234 rapidly diffuses a local heat of the array substrate 222 to improve a temperature uniformity of the display panel 220.

A heat radiation property can be judged according to a maximum temperature of nine temperatures at nine points of a display panel displaying an image, and a temperature uniformity can be judged according to a deviation between a maximum temperature and a minimum temperature of nine temperatures at nine points of a display panel displaying an image.

For example, the OLED display device 110 according to the first embodiment can have maximum temperatures of about 73.4 degrees and about 75.1 degrees when an image of a yellow box pattern having a luminance of about 250 nit is displayed, and the OLED display device 110 according to the first embodiment can have maximum temperatures of about 77.2 degrees and about 74.5 degrees when an image of a yellow box pattern having a luminance of about 350 nit is displayed.

Further, the OLED display device 210 according to the second embodiment can have maximum temperatures of about 41.4 degrees and about 41.1 degrees when an image of a yellow box pattern having a luminance of about 250 nit is displayed, and the OLED display device 210 according to the second embodiment can have maximum temperatures of about 42.0 degrees and about 42.4 degrees when an image of a yellow box pattern having a luminance of about 350 nit is displayed. As a result, the maximum temperature of a predetermined pattern image of the OLED display device 210 according to the second embodiment is reduced by a temperature over about 30 degrees as compared with the OLED display device 110 according to the first embodiment.

In example, the OLED display device 110 according to the first embodiment can have deviations of maximum and minimum temperatures of about 9.8 degrees and about 18.7 degrees when an image of a full white having luminances of about 250 nit and about 350 nit is displayed. The OLED display device 210 according to the second embodiment can have deviations of maximum and minimum temperatures of about 6.2 degrees and about 12.1 degrees when an image of a full white having luminances of about 250 nit and 350 nit is displayed. As a result, the deviation of maximum and minimum temperatures of the OLED display device 210 according to the second embodiment is reduced by a value over about 3.6 degrees as compared with the OLED display device 110 according to the first embodiment.

Accordingly, the OLED display device 210 according to the second embodiment has an improved heat radiation property and an improved temperature uniformity due to a rapid diffusion of a local heat by the heat conductive adhesive layer 232 and the protecting substrate 234 as compared with the OLED display device 110 according to the first embodiment.

The protecting substrate 234 can be formed of a metallic material. For example, the protecting substrate 230 can have a thickness over about 0.50 mm, a Young's modulus of about 200 GPa and a density of about 0.282 lb/in$^3$. The protecting substrate 234 of an electro galvanized iron (EGI) can have a heat conductivity of about 52 W/mK, and the protecting substrate 234 of aluminum (Al) can have a heat conductivity of about 167 W/mK.

The protecting substrate 234 blocks an external moisture or an external oxygen penetrating into the array substrate 222.

The pattern film 236 is attached to a second surface of the protecting substrate 234. The pattern film 236 can include patterns so that an exterior of the OLED display device 210 can have various designs and colors.

The PCB 270 is disposed under the display panel 220. The PCB 270 generates a plurality of control signals and an image data using a plurality of timing signals and an image signal and transmits the plurality of control signals and the image data to an integrated circuit (IC) through a flexible printed circuit (FPC).

The integrated circuit can be mounted on the flexible printed circuit. The integrated circuit can generate a gate signal and a data signal using the plurality of control signals and the image data and can transmit the gate signal and the data signal to the display panel 220 through the flexible printed circuit.

The PCB 270 can be fixed to the protecting substrate 234 of the display panel 220. These features will be illustrated with reference to drawings.

Figure 6A:
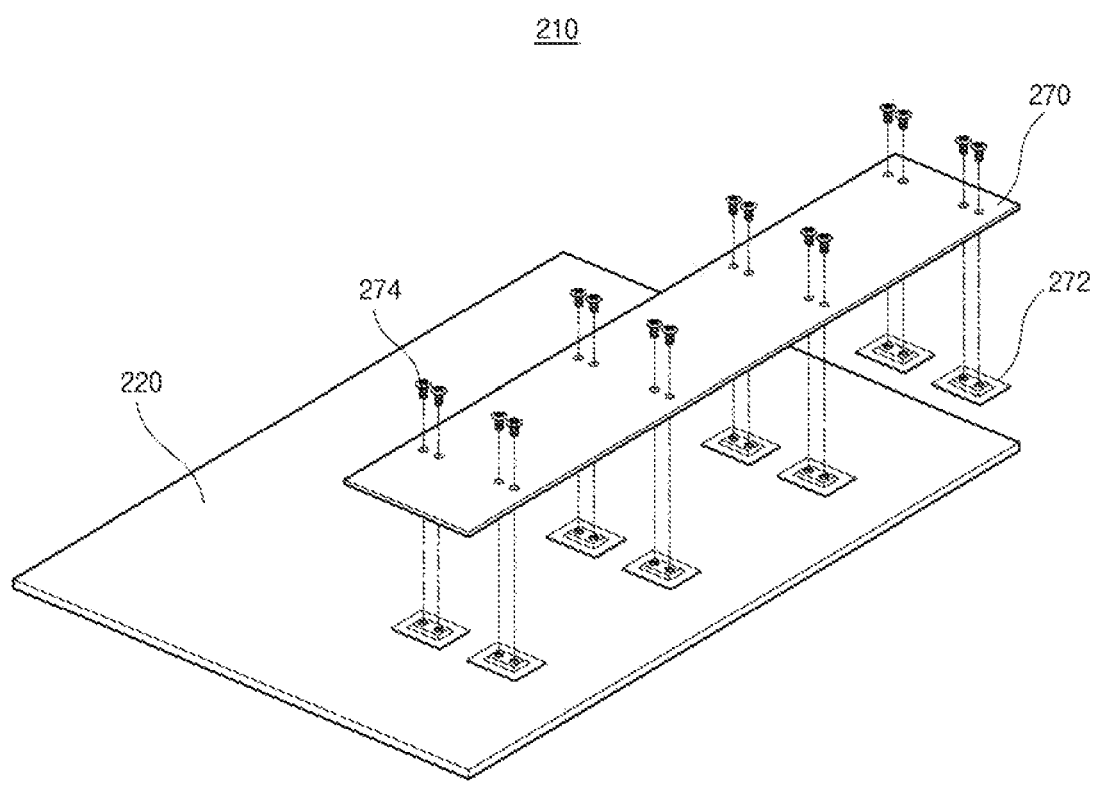
FIG. 6A is an exploded perspective view showing a protecting substrate and a printed circuit board of the organic light emitting diode display device according to the second embodiment of the present disclosure.
Figure 6B:
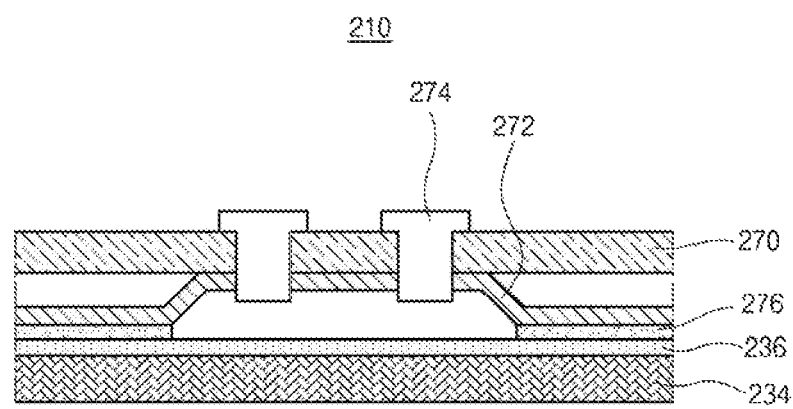
FIG. 6B is a cross-sectional view, respectively, showing the protecting substrate and the printed circuit board of the organic light emitting diode display device according to the second embodiment of the present disclosure.

FIGS. 6A and 6B are an exploded perspective view and a cross-sectional view, respectively, showing a protecting substrate and a printed circuit board of the organic light emitting diode display device according to the second embodiment of the present disclosure.

In FIGS. 6A and 6B, the PCB 270 of the OLED display device 210 is fixed to the protecting substrate 234 of the display panel 220 using a plurality of brackets 272 and a plurality of bolts 274.

The plurality of brackets 272 are disposed on and fixed to a rear surface of the protecting substrate 234 (or the pattern film 236) through a resin layer 276, and each of the plurality of brackets 272 can have at least two nut holes.

The PCB 270 can have a plurality of combining holes corresponding to the nut holes of the plurality of brackets 272. The plurality of bolts 274 are combined to the nut holes of the plurality of brackets 272 through the plurality of combining holes of the PCB 270, and the PCB 270 is fixed to the protecting substrate 234 of the display panel 220.

Since the plurality of brackets 272 are fixed to the protecting substrate 234 using the resin layer 276 and the PCB 270 is fixed to the protecting substrate 234 using the plurality of bolts 274, the PCB 270 can be fixed to the display panel 220 without forming combining holes in the protecting substrate 234 blocking an external moisture or an external oxygen.

In the OLED display device 210 according to the second embodiment of the present disclosure, since the protecting substrate 234 of the display panel 220 is formed of a metallic material, the PCB 270 is attached directly to the display panel 220 without an additional frame. As a result, an exterior of various designs and colors is obtained and a rigidity is improved.

Since the array substrate 222 is attached to the protecting substrate 234 through the heat conductive adhesive layer 232, deterioration such as a detachment of the display panel 220 is prevented and an attachment reliability is improved.

Since a gap does not exist between the array substrate 222 and the protecting substrate 234, deterioration such as crack of the display panel 220 due to a press caused by an external pressure is prevented.

The OLED display device 210 has an exterior of various designs and colors using the pattern film 236.

Since the protecting substrate 234 is formed of a metallic material and the heat conductive adhesive layer 232 includes a material having a relatively high heat conductivity, a heat radiation property of the OLED display device 210 is improved.

In another embodiment, the face sealing metal layer 230 and the heat conductive adhesive layer 232 can be omitted. These features will be illustrated with reference to drawings.

Figure 7:
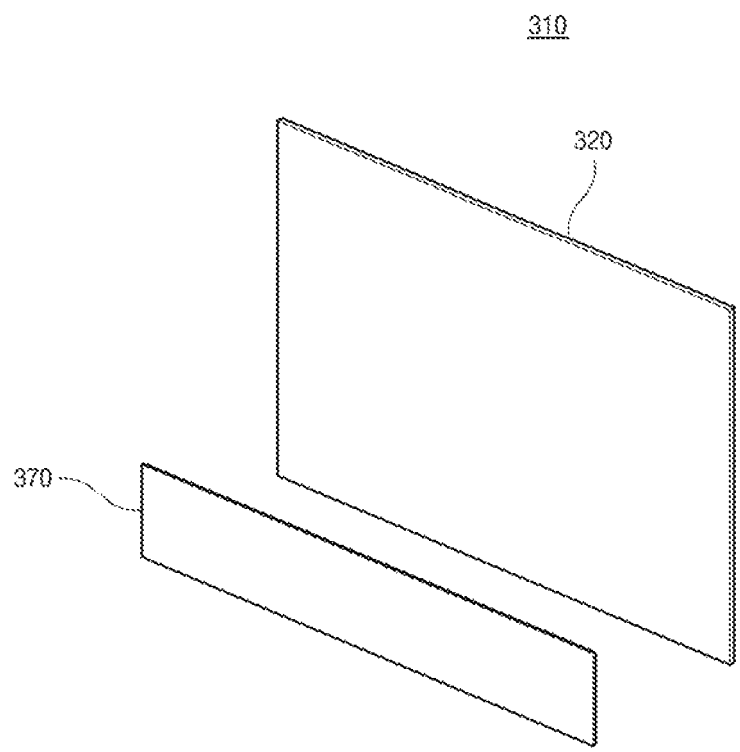
FIG. 7 is an exploded perspective view showing an organic light emitting diode display device according to a third embodiment of the present disclosure.
Figure 8:
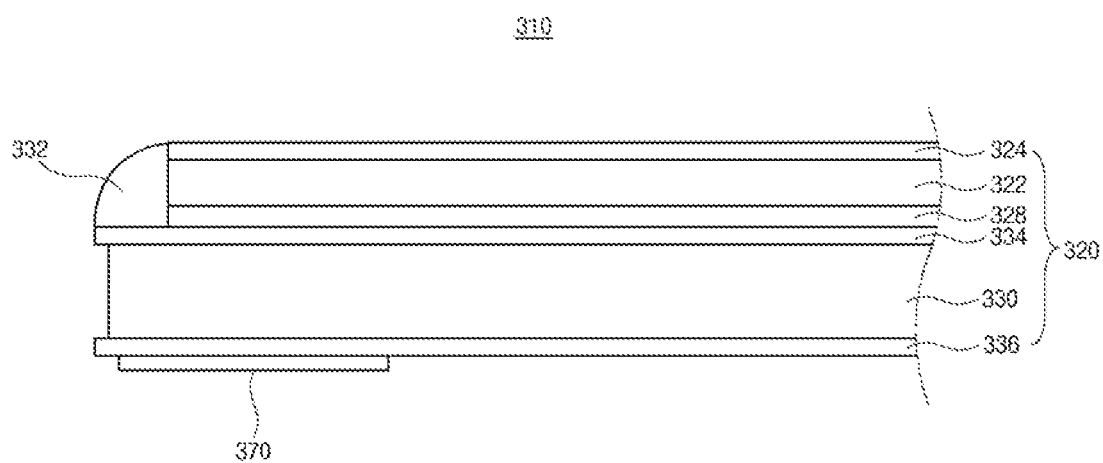
FIG. 8 is a cross-sectional view showing the organic light emitting diode display device according the a third embodiment of the present disclosure.

FIG. 7 is an exploded perspective view showing an organic light emitting diode display device according to a third embodiment of the present disclosure, and FIG. 8 is a cross-sectional view showing the organic light emitting diode display device according to the third embodiment of the present disclosure.

In FIGS. 7 and 8, an organic light emitting diode (OLED) display device 310 according to a third embodiment of the present disclosure includes a display panel 320 and a printed circuit board (PCB) 370.

The display panel 320 includes an array substrate 322, a polarizing plate 324, a face sealing adhesive layer 328, a side sealing layer 332, first and second pattern films 334 and 336 and a protecting substrate 330.

The array substrate 322 displays an image using a gate signal and a data signal, and the polarizing plate 324 prevents reflection of an external light.

The polarizing plate 324 is attached to a first surface of the array substrate 322, and the face sealing adhesive layer 3328 is attached to a second surface of the array substrate 322. The face sealing adhesive layer 328 blocks an external moisture or an external oxygen penetrating into the array substrate 322.

The protecting substrate 330 is attached to a lower surface of the face sealing adhesive layer 328. The protecting substrate 330 maintains a rigidity of the array substrate 322 and blocks an external moisture or an external oxygen penetrating into the array substrate 322.

The first and second pattern films 334 and 336 are attached to first and second surfaces, respectively, of the protecting substrate 330. The protecting substrate 330 has a size greater than the polarizing plate 324, the array substrate 322 and the face sealing adhesive layer 328 and is attached to a second surface of the array substrate 322.

The side sealing layer 332 covers side surfaces of the array substrate 322 and the polarizing plate 324 and a portion of the first pattern film 334 exposed through the side surface of the face sealing adhesive layer 328, the array substrate 322 and the polarizing plate 324 to block an external moisture or an external oxygen penetrating into the array substrate 322.

The first and second pattern films 334 and 336 can include patterns so that an exterior of the OLED display device 310 can have various designs and colors.

The protecting substrate 330 can be formed of a glass. For example, the protecting substrate 330 can have a thickness over about 0.50 mm (preferably, over about 3.00 mm), a Young's modulus of about 71.5 GPa and a density of about 0.0874 lb/in$^3$. To improve a radiation property, the first and second pattern films 334 and 336 can include a heat conductive material such as a metal particle.

Alternatively, the protecting substrate 330 can be formed of a metallic material. For example, the protecting substrate 330 can have a thickness over about 0.50 mm (preferably, over about 3.00 mm), a Young's modulus of about 200 GPa and a density of about 0.282 lb/in$^3$. The protecting substrate 330 of an electro galvanized iron (EGI) can have a heat conductivity of about 52 W/mK, and the protecting substrate 330 of aluminum (Al) can have a heat conductivity of about 167 W/mK.

When the OLED display device 310 displays images of luminances of about 150 nit, about 200 nit, about 300 nit and about 400 nit, the display panel 320 having the protecting substrate 330 of a thickness of about 0.50 mm can have minimum temperatures of about 31.5 degrees, about 36.2 degrees, about 45.2 degrees and about 54.5 degrees, respectively, and the display panel 320 having the protecting substrate 330 of a thickness of about 2.00 mm can have minimum temperatures of about 26.7 degrees, about 30.7 degrees, about 38.3 degrees and about 46.2 degrees, respectively. Further, the display panel 320 having the protecting substrate 330 of a thickness of about 3.00 mm can have minimum temperatures of about 26.2 degrees, about 30.1 degrees, about 37.5 degrees and about 45.3 degrees, respectively, and the display panel 320 having the protecting substrate 330 of a thickness of about 4.00 mm can have minimum temperatures of about 26.2 degrees, about 30.1 degrees, about 37.5 degrees and about 45.3 degrees, respectively. The display panel 320 having the protecting substrate 330 of a thickness smaller than about 0.50 mm can have a minimum temperature greater than about 55 degrees for an image of a luminance of about 400 nit. As a result, a heat of the display panel 320 having the protecting substrate 330 of a thickness greater than about 0.50 mm is radiated, and a heat of the display panel 320 having the protecting substrate 330 of a thickness smaller than about 0.50 mm is not radiated such that elements of the display panel 320 can be deteriorated.

When the protecting substrate 330 is formed of a metallic material, the first pattern film 334 is not recognized at a rear surface of the display panel 310 and the first pattern film 334 can be omitted.

The PCB 370 is disposed under the display panel 320. The PCB 370 generates a plurality of control signals and an image data using a plurality of timing signals and an image signal and transmits the plurality of control signals and the image data to an integrated circuit (IC) through a flexible printed circuit (FPC).

The integrated circuit can be mounted on the flexible printed circuit. The integrated circuit can generate a gate signal and a data signal using the plurality of control signals and the image data and can transmit the gate signal and the data signal to the display panel 320 through the flexible printed circuit.

The PCB 370 can be fixed to the protecting substrate 330 of the display panel 320. These features will be illustrated with reference to drawings.

Figure 9A:
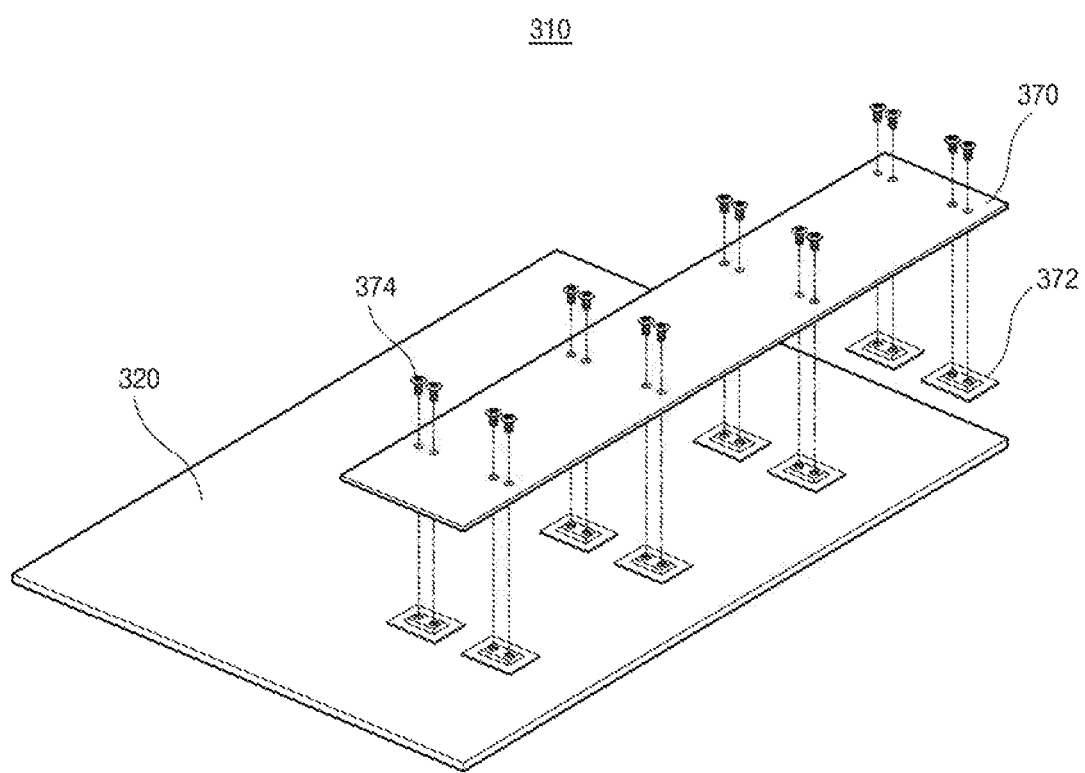
FIG. 9A is an exploded perspective view showing a protecting substrate and a printed circuit board of the organic light emitting diode display device according to the third embodiment of the present disclosure.
Figure 9B:
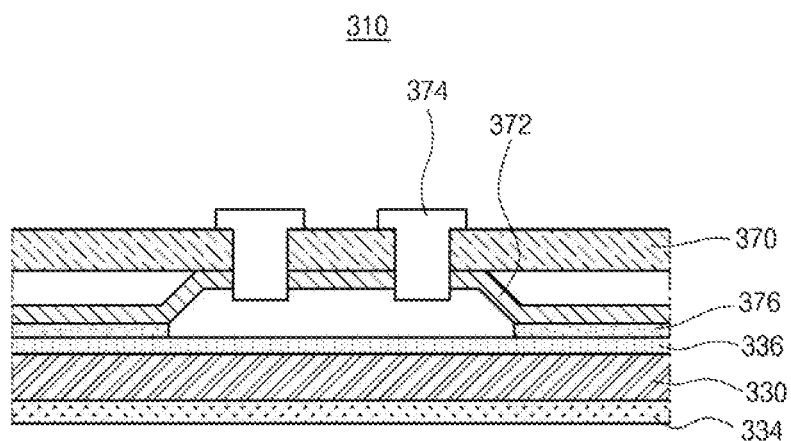
FIG. 9B is a cross-sectional view showing the protecting substrate and the printed circuit board of the organic light emitting diode display device according the a third embodiment of the present disclosure.

FIGS. 9A and 9B are an exploded perspective view and a cross-sectional view, respectively, showing a protecting substrate and a printed circuit board of the organic light emitting diode display device according to the third embodiment of the present disclosure.

In FIGS. 9A and 9B, the PCB 370 of the OLED display device 310 is fixed to the protecting substrate 330 of the display panel 320 using a plurality of brackets 372 and a plurality of bolts 374.

The plurality of brackets 372 are disposed on and fixed to a rear surface of the protecting substrate 330 (or the second pattern film 336) through a resin layer 376, and each of the plurality of brackets 372 can have at least two nut holes.

The PCB 370 can have a plurality of combining holes corresponding to the nut holes of the plurality of brackets 372. The plurality of bolts 374 are combined to the nut holes of the plurality of brackets 372 through the plurality of combining holes of the PCB 370, and the PCB 370 is fixed to the protecting substrate 330 of the display panel 320.

Since the plurality of brackets 372 are fixed to the protecting substrate 330 using the resin layer 376 and the PCB 370 is fixed to the protecting substrate 330 using the plurality of bolts 374, the PCB 370 can be fixed to the display panel 320 without forming combining holes in the protecting substrate 330 blocking an external moisture or an external oxygen.

Figure 10:
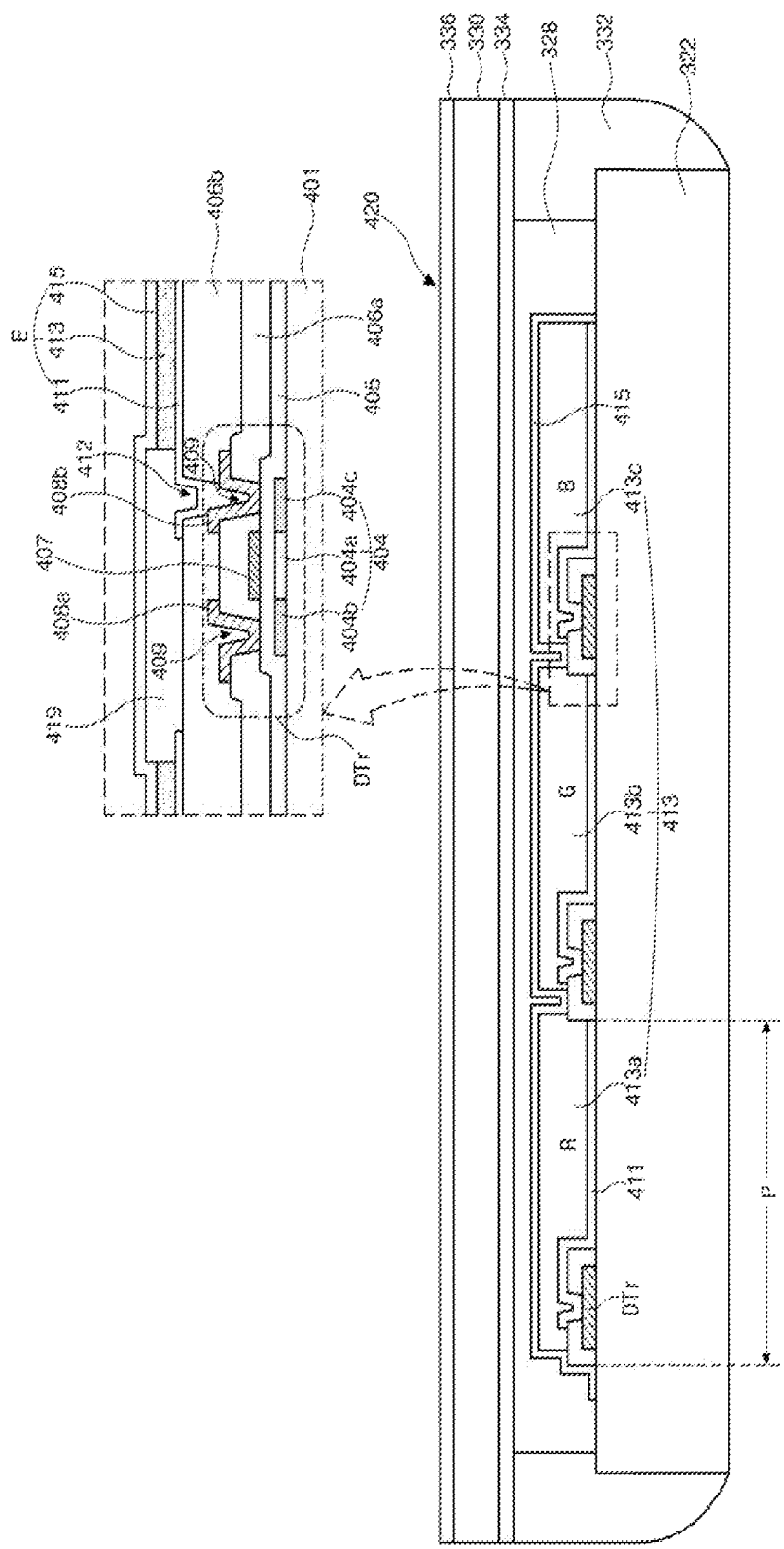
FIG. 10 is a cross-sectional view showing a display panel of the organic light emitting diode display device according to the third embodiment of the present disclosure.

FIG. 10 is a cross-sectional view showing a display panel of the organic light emitting diode display device according to the third embodiment of the present disclosure.

In FIG. 10, the display panel 320 includes the array substrate 322, the face sealing adhesive layer 328, the side sealing layer 332, the protecting substrate 330 and the first and second pattern films 334 and 336.

A semiconductor layer 404 is disposed in a pixel region P on the array substrate 322. The semiconductor layer 404 includes an active region 404a in a central portion which includes an intrinsic silicon and constitutes a channel, and a source region 404b and a drain region 404c at both sides of the active region 404a which includes silicon doped with impurities.

A gate insulating layer 405 is disposed on a whole of the array substrate 322 having the semiconductor layer 404.

A gate electrode 407 is disposed on the gate insulating layer 405 corresponding to the active region 404a of the semiconductor layer 404, and a gate line connected to the gate electrode 407 is disposed on the gate insulating layer 405.

A first interlayer insulating layer 406a is disposed over a whole of the array substrate 322 having the gate electrode 407 and the gate line. The first interlayer insulating layer 406a and the gate insulating layer 405 have first and second semiconductor contact holes 409 exposing the source region 404b and the drain region 404c, respectively, of the semiconductor layer 404.

A source electrode 408a and a drain electrode 408b spaced apart from each other are disposed on the first interlayer insulating layer 406a. The source electrode 408a and the drain electrode 408b are connected to the source region 404b and the drain region 404c, respectively, through the first and second semiconductor contact holes 409.

A second interlayer insulating layer 406b is disposed on the source electrode 408a, the drain electrode 408b and the first interlayer insulating layer 406a exposed outside the source electrode 408a and the drain electrode 408b. The second interlayer insulating layer 406b has a drain contact hole 412 exposing the drain electrode 408b.

The source electrode 408a, the drain electrode 408b, the semiconductor layer 404 including the source region 404b and the drain region 404c contacting the source electrode 408a and the drain electrode 408b, respectively, the gate insulating layer 405 on the semiconductor layer 404 and the gate electrode 407 constitute a driving thin film transistor (TFT) DTr.

Further, a data line crossing the gate line to define a pixel region P is disposed on the first interlayer insulating layer 406a, and a switching TFT having the same structure as the driving TFT DTr is connected to the driving TFT DTr.

While the switching TFT and the driving TFT DTr exemplarily have a co-planar type where the semiconductor layer 404 includes polycrystalline silicon in the third embodiment of FIG. 10, the switching TFT and the driving TFT DTr can have a bottom gate type where the semiconductor layer includes intrinsic silicon and silicon doped with impurities in another embodiment.

A first electrode 411 of a material having a relatively high work function connected to the drain electrode 408b of the driving TFT DTr is disposed in a region where an image is displayed on the second interlayer insulating layer 406b.

The first electrode 411 is disposed in each pixel region P, and a bank layer 419 is disposed between the first electrodes 411 of the adjacent pixel regions P.

The first electrode 411 is separated in each pixel region P with the bank layer 419 as a border between the adjacent pixel regions P.

A light emitting layer 413 is disposed on the first electrode 411.

The light emitting layer 413 can have a single layered structure of an emitting material or a multiple layered structure of a hole injecting layer (HIL), a hole transporting layer (HTL), an emitting material layer (EML), an electron transporting layer (ETL) and an electron injecting layer (EIL) for increasing an emission efficiency.

The light emitting layer 413 can emit red, green and blue colored lights. For example, the light emitting layer 413 can include red, green and blue light emitting layers 413a, 413b and 413c.

A second electrode 415 is disposed on a whole of the array substrate 322 having the light emitting layer 413.

The first electrode 411, the light emitting layer 413 and the second electrode 415 constitute a light emitting diode E. The first electrode 411 can be one of an anode and a cathode, and the second electrode 415 can be the other of an anode and a cathode.

For example, the second electrode 415 can have a double layered structure where a half transparent metal layer has a metallic material having a relatively low work function and having a relatively small thickness and a transparent conductive layer has a transparent conductive material having a relatively great thickness. The display panel 320 can be driven as a top emission type where a light of the light emitting layer 413 is emitted through the second electrode 415.

Alternatively, the second electrode 415 can have an opaque metal layer. The display panel 320 can be driven as a bottom emission type where a light of the light emitting layer 413 is emitted through the first electrode 411.

When a voltage is applied to the first electrode 411 and the second electrode 415 according to a selected color signal, a hole from the first electrode 411 and an electron from the second electrode 415 are transported to the light emitting layer 413 to constitute an exciton. When the exciton transitions from an excited state to a ground state, a light is generated to be emitted as a visible ray.

The light can be emitted through the second electrode 415 or the first electrode 411 to an exterior, and the display panel 320 can display an image.

The protecting substrate 330 is disposed over the driving TFT DTr and the light emitting diode E, and the array substrate 322 and the protecting substrate 330 are attached to each other through the face sealing adhesive layer 328 such that the display panel 320 is encapsulated.

The face sealing adhesive layer 328 prevents penetration of an external moisture or an external oxygen into the light emitting diode E to protect the driving TFT DTr and the light emitting diode E on the array substrate 322. The face sealing adhesive layer 328 is disposed over the array substrate 322 to wrap the light emitting diode E.

The face sealing adhesive layer 328 can be formed of one of an optically cleared adhesive (OCA), a heat curable resin and a heat curable sealant and can seal the driving TFT DTr and the light emitting diode E on the array substrate 322.

The array substrate 322 can be formed of one of a glass, a plastic and a metal.

When the array substrate 322 is formed of a metal foil, the array substrate 322 can have a thickness of about 100 μm. Since the array substrate 322 of a metal foil has a relatively small thickness as compared with the array substrate 322 of a glass or a rolled steel material, the total thickness of the display panel 320 can be reduced. In addition, a durability of the display panel 320 can be improved even with the reduced total thickness.

In the OLED display device 310 according to the third embodiment of the present disclosure, since the protecting substrate 330 of the display panel 320 is formed of a glass or a metallic material having a thickness greater than about 3.0 mm, the PCB 370 is attached directly to the display panel 320 without an additional frame. As a result, an exterior of various designs and colors is obtained and a rigidity is improved.

Since the array substrate 322 is attached to the protecting substrate 330 through the face sealing adhesive layer 328, deterioration such as a detachment of the display panel 320 is prevented and an attachment reliability is improved.

Since a gap does not exist between the array substrate 322 and the protecting substrate 330, deterioration such as crack of the display panel 320 due to a press caused by an external pressure is prevented.

The OLED display device 310 has an exterior of various designs and colors using the first and second pattern films 334 and 336.

Since the first and second pattern films 334 and 336 on the protecting substrate 330 of a glass include a material having a relatively high heat conductivity or the protecting substrate 330 includes a metallic material having a relatively high heat conductivity, a heat radiation property of the OLED display device 310 is improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a display panel including an array substrate configured to display an image, a face sealing adhesive layer attached to the array substrate, a side sealing layer covering a side surface of the array substrate, and a protecting substrate attached to the array substrate through the face sealing adhesive layer; and
    a printed circuit board attached to the protecting substrate,
    wherein the printed circuit board generates a plurality of control signals and an image data and transmits the plurality of control signals and the image data to an integrated circuit,
    wherein the integrated circuit generates a gate signal and a data signal using the plurality of control signals and the image data and transmits the gate signal and the data signal to the display panel, and
    wherein the face sealing adhesive layer is attached to a whole of a surface of the array substrate.

2. The organic light emitting diode display device of claim 1, wherein the display panel further includes:
    a face sealing metal layer under the face sealing adhesive layer, and
    a heat conductive adhesive layer under the face sealing metal layer.

3. The organic light emitting diode display device of claim 2, wherein the protecting substrate includes a metallic material, and
    wherein a pattern film is disposed on the protecting substrate.

4. The organic light emitting diode display device of claim 2, where the heat conductive adhesive layer includes a resin and a heat conductive material.

5. The organic light emitting diode display device of claim 1, wherein the protecting substrate has a thickness greater than approximately 0.50 mm.

6. The organic light emitting diode display device of claim 5, wherein the protecting substrate includes a glass,
    wherein first and second pattern film are disposed on both sides, respectively, of the protecting substrate, and
    wherein the first pattern film includes a metal particle.

7. The organic light emitting diode display device of claim 5, wherein the protecting substrate includes a metallic material, and
    wherein a first pattern film is disposed on the protecting substrate.

8. The organic light emitting diode display device of claim 1, further comprising a plurality of brackets fixed to the protecting substrate through a resin layer.

9. The organic light emitting diode display device of claim 1, wherein the array substrate includes a switching thin film transistor, a driving thin film transistor connected to the switching thin film transistor and a light emitting diode connected to the driving thin film transistor.

10. An organic light emitting diode display device, comprising:
    a display panel including an array substrate configured to display an image, a face sealing adhesive layer attached to the array substrate, a side sealing layer covering a side surface of the array substrate, and a protecting substrate attached to the array substrate through the face sealing adhesive layer;
    a printed circuit board attached to the protecting substrate; and
    a plurality of brackets fixed to the protecting substrate through a resin layer,
    wherein each of the plurality of brackets has at least two nut holes,
    wherein the printed circuit board has a plurality of combining holes corresponding to the at least two nut holes of the plurality of brackets, and
    wherein the printed circuit board is fixed to the protecting substrate by combining a plurality of bolts to the at least two nut holes of the plurality of brackets through the plurality of combining holes of the printed circuit board.

* * * * *